United States Patent [19]

Kim

[11] Patent Number: 5,371,715
[45] Date of Patent: Dec. 6, 1994

[54] BIT LINE SENSING CONTROL CIRCUIT FOR A SEMICONDUCTOR MEMORY DEVICE

[75] Inventor: Myung-Ho Kim, Suwon, Rep. of Korea

[73] Assignee: Samsung Electronics Co., Ltd., Suwon, Rep. of Korea

[21] Appl. No.: 65,390

[22] Filed: May 20, 1993

[30] Foreign Application Priority Data

May 20, 1992 [KR] Rep. of Korea ............... 8473/1992

[51] Int. Cl.$^5$ .............................................. G11C 8/00
[52] U.S. Cl. ................................. 365/233; 365/194; 365/230.03
[58] Field of Search ................ 365/230.03, 233, 191, 365/194, 195

[56] References Cited

U.S. PATENT DOCUMENTS 4,739,502  4/1988  Nozaki ........................... 365/233

Primary Examiner—Joseph A. Popek
Attorney, Agent, or Firm—Cushman, Darby & Cushman

[57] ABSTRACT

A bit-line sensing control circuit includes a first circuit for activating a word line and a bit line associated with a first block of a memory cell array in response to a first initial activating clock. A delay circuit generates a second initial activating clock from the first initial activating clock a predetermined period after the first initial activation clock. A second circuit for activating a word line and a bit line associated with a second block of the memory cell array is initiated in response to the second initial activating clock. Because the second block of memory cells are sensed after the first block of memory cells, spike noise related problems are substantially avoided.

19 Claims, 6 Drawing Sheets

BIT LINE SENSING CONTROL CIRCUIT FOR A SEMICONDUCTOR MEMORY DEVICE

BACKGROUND OF THE INVENTION

The present invention relates to a semiconductor memory device, particularly to a circuit sensing voltage level on a bit line in the semiconductor memory device.

Prior art semiconductor memory device designs reduce bit-line sensing noise by dividing the memory cell array into several blocks, for example four memory cell array blocks BLK1, BLK2, BLK3 and BLK4 as shown in FIG. 1, or by decreasing the mutual capacitance between one bit line and another one. The sensing operations of bit lines in a dynamic random access memory (DRAM) is made to all of selected bit lines, even if divided into blocks, at the same time. In other devices, such as field memory (or frame memory) or DRAM-equipped application specific integrated circuits (ASIC), the sensing operation can be provided to each one of the memory cell array blocks at different times, due to sufficient row access time, and so disperse noise and peak current.

FIG. 2 illustrates a well known DRAM column circuitry, which includes a memory cell 21, a sense amplifier 22 and an equalizing circuit 26. Sense amplifier 22 consists of n-type MOS transistors 23, 24 and 25 and p-type MOS transistors 27 and 28, which together amplify and develops the voltage difference between bit lines BL and BLB after a word line WL is activated to select a memory cell 21. Memory cell selection is controlled by sensing signals LA and LSAEG. Equalizing circuit 26, which consists of n-type MOS transistors 29, 31 and 32, pre-charges and equalizes both bit lines with equalizing voltage VBL before and after a read or write operation of DRAM, being controlled by equalizing signal $\phi$EQ.

FIG. 3 shows a block diagram of a conventional bit-line sensing control circuit, consisting of an enable clock generator 10, a word-line enable circuit 30, a bit-line sensing enable circuit 50 and a bit-line sensing driver 70. The enable clock generator 10 generates an initial activating clock $\phi$1 after receiving an address informing signal LXE, which is obtained when the external address becomes valid. The external address becomes valid when the row address strobe signal ($\overline{RAS}$) transitions to the logic state "low", and after the initial activating clock $\phi$1, the a word-line enable circuit 30 generates makes word-line enable signal $\phi$X1. Then the bit-line sensing enable circuit 50 generates a bit-line sensing enable signal $\phi$S1 and as a result, p- type and n-type sensing signals LA1 and LSAEG1, respectively, are generated from the bit-line sensing driver 70, which receives the bit-line sensing enable signal $\phi$S1. The sensing signals are then applied to the sense amplifiers 22 of FIG. 1. The number of sense amplifiers corresponds to the number of columns in the memory cell array blocks, such as blocks BLK1, BLK2, BLK3 and BLK4 as illustrated in FIG. 1.

Since, however, one of the sense amplifiers embedded in each one of the memory cell array blocks is put into the simultaneous sensing operation together with sense amplifiers belonging to other memory cell array blocks, selected pairs of bit lines are simultaneously developed, the bit line BL going to "high" or "low" level while the bit-line $\overline{BL}$ to "low" or "high" level. It is, also, well known that a noise such as spike currents may be generated during the bit-line sensing operation because of large bit-line voltage swings between power supply voltage and ground voltage. Therefore, in the conventional scheme in which all bit lines are simultaneously sensed in each of the memory cell array blocks, the sensing noises due to spike currents that may occur at the same time can result in faulty memory operation.

SUMMARY OF THE INVENTION

Accordingly, an object of this invention is to provide a bit-line sensing control circuit which can reduce the sensing noises due to spike currents during the bit-line sensing operation in a semiconductor memory device.

It is another object of this invention to provide a bit-line sensing control circuit which can reduce the sensing noises due to spike currents during the bit-line sensing operation in a semiconductor memory device having a plurality of bit-line pairs disposed within each of a plurality of memory cell array blocks.

According to this invention, there is provided a bit-line sensing control circuit comprising a first means for activating a word line and a bit line which belong to a first block of the memory cell array being controlled by a first initial activating clock, a delay circuit for generating a second initial activating clock from the first initial activating clock a predetermined time after the first initial activating clock, a second means for activating a word line and a bit line which belong to a second block of the memory cell array and being initiated in response to the second initial activating clock.

In addition to this, the circuit according to this invention also comprises a first equalizing signal generator for generating a first equalizing signal applied to the first memory blocks and a second equalizing signal generator for generating a second equalizing signal applied to the second memory blocks.

DETAILED DESCRIPTION OF THE PREFERRED EMBODIMENT

Figure 2:
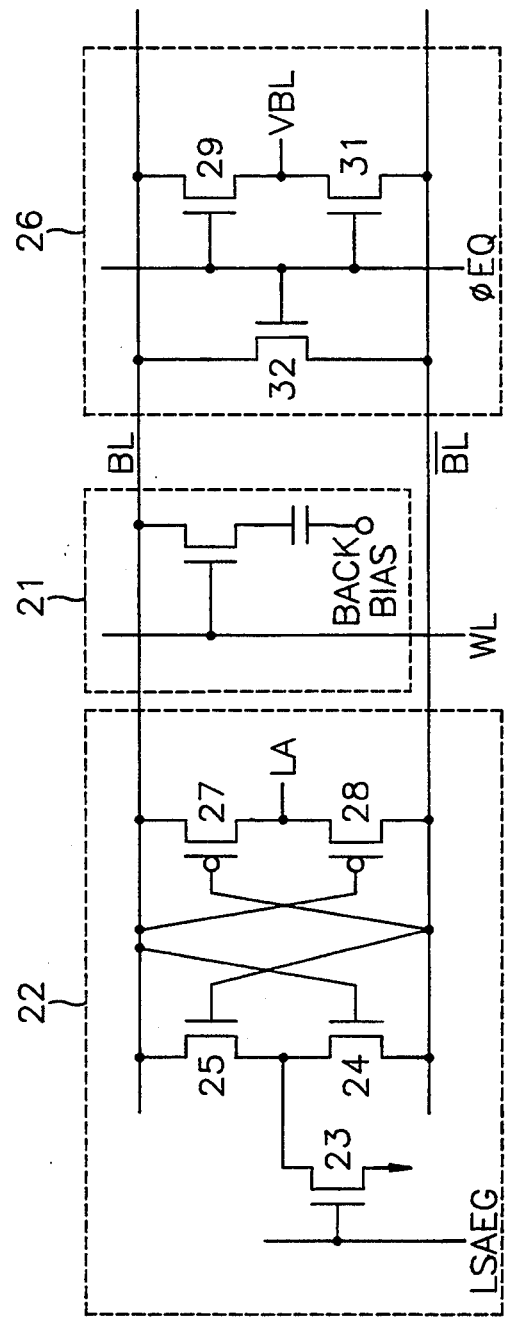
FIG. 2 is a circuit diagram of a general column circuitry in one of the blocks of the semiconductor memory device, illustrating a sense amplifier, a memory cell and a pair of bit-lines, and a precharge/equalizing circuit.
Figure 4:
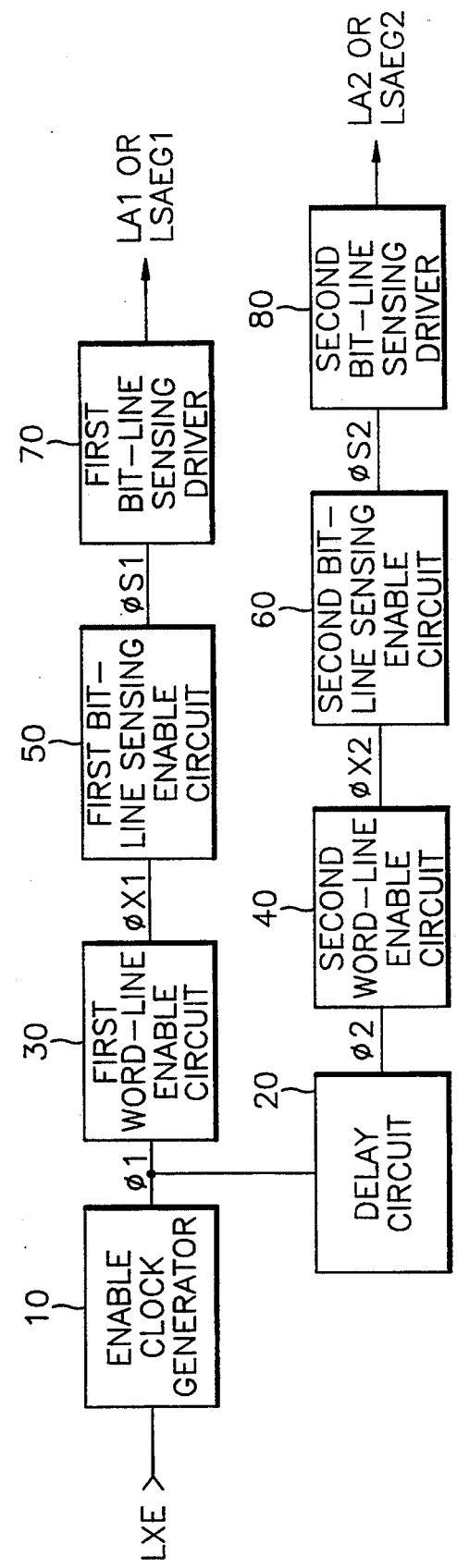
FIG. 4 is a functional block diagram illustrating an embodiment of a bit-line sensing control circuit according to the present invention.

Referring to FIG. 4, a bit-line sensing control circuit according to an embodiment of the present invention contains an enable clock generator 10 that generates a first initial activating clock $\phi 1$ from an address informing clock LXE. Delay circuit 20 generates a second initial activating clock $\phi 2$ delayed from the first initial activating clock $\phi 1$. First word-line enable circuit 30 generates a first word-line enable signal $\phi X1$ from the first initial activating clock $\phi 1$. Second word-line enable circuit 40 generates a second word-line enable signal $\phi X2$ from the second initial activating clock $\phi 2$. First bit-line sensing enable circuit 50 generates a first bit-line sensing enable signal $\phi S1$ from the first word-line enable signal $\phi X1$. Second bit-line sensing enable circuit 60 generates a second bit-line sensing enable signal $\phi S2$ from the second word-line enable signal $\phi X2$. First bit-line sensing driver 70 generates both first p-type and n-type sensing signals LA1 and LSAEG1 from the first bit-line sensing enable signal $\phi S1$. Second bit-line sensing driver 80 generates second p-type and n-type sensing signals LA2 and LSAEG2. The sensing signals LA1, LSAEG1, LA2 and LSAEG2 are applied to a sense amplifier such as illustrated in FIG. 2.

Figure 3:
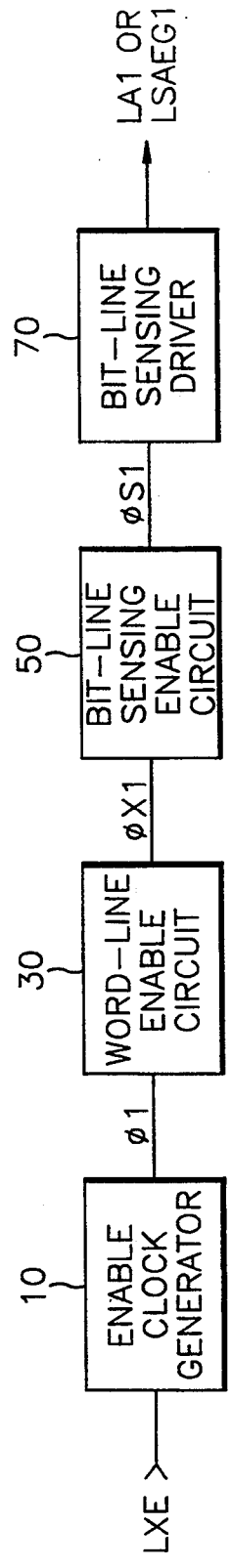
FIG. 3 is a functional block diagram of a conventional bit-line sensing control circuit.
Figure 5A:
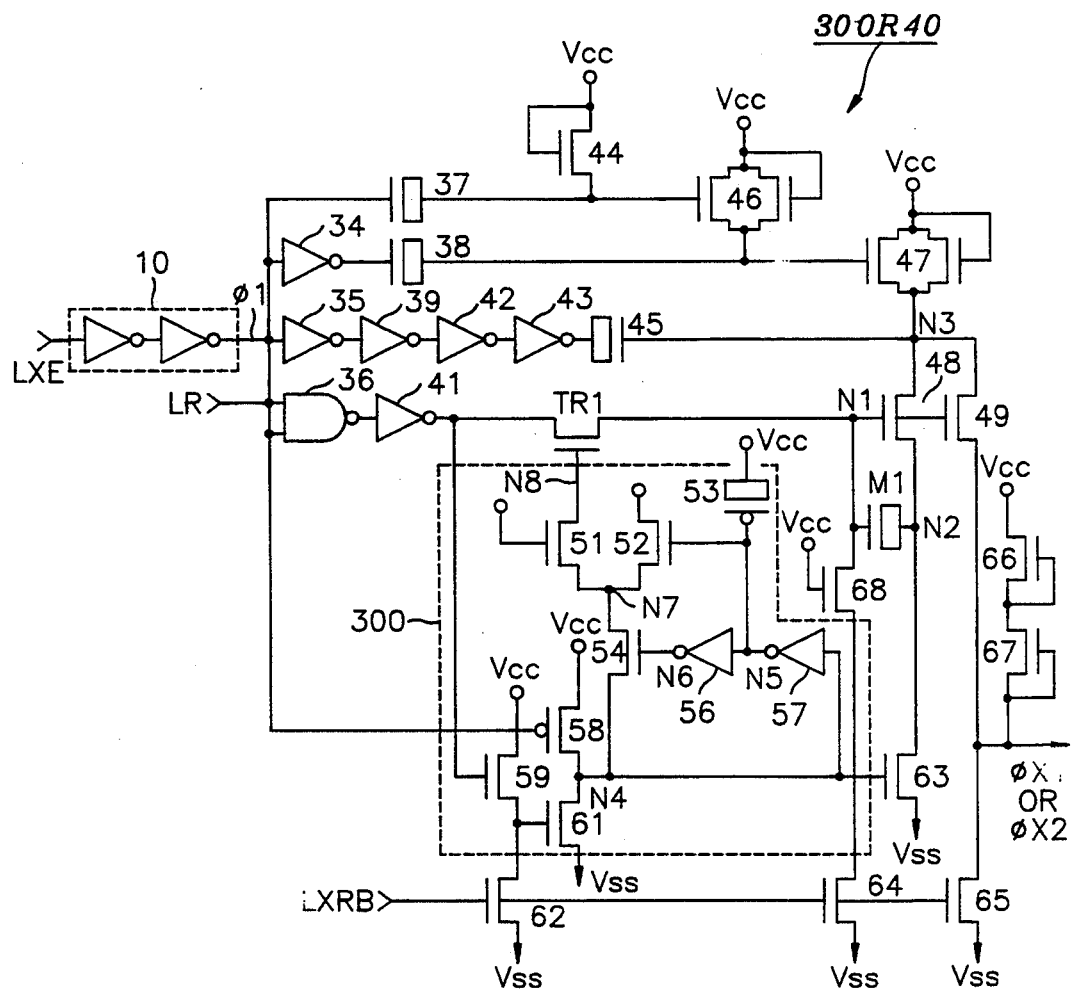
FIG. 5A is a circuit diagram of the first or second word-line enable circuit of FIG. 4.
Figure 5B:
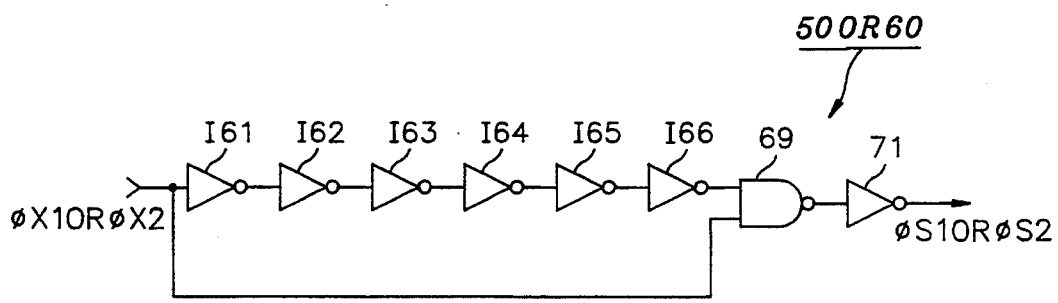
FIG. 5B is a circuit diagram of the first or second bit-line sensing enable circuit of FIG. 4.
Figures 5C, 5D:
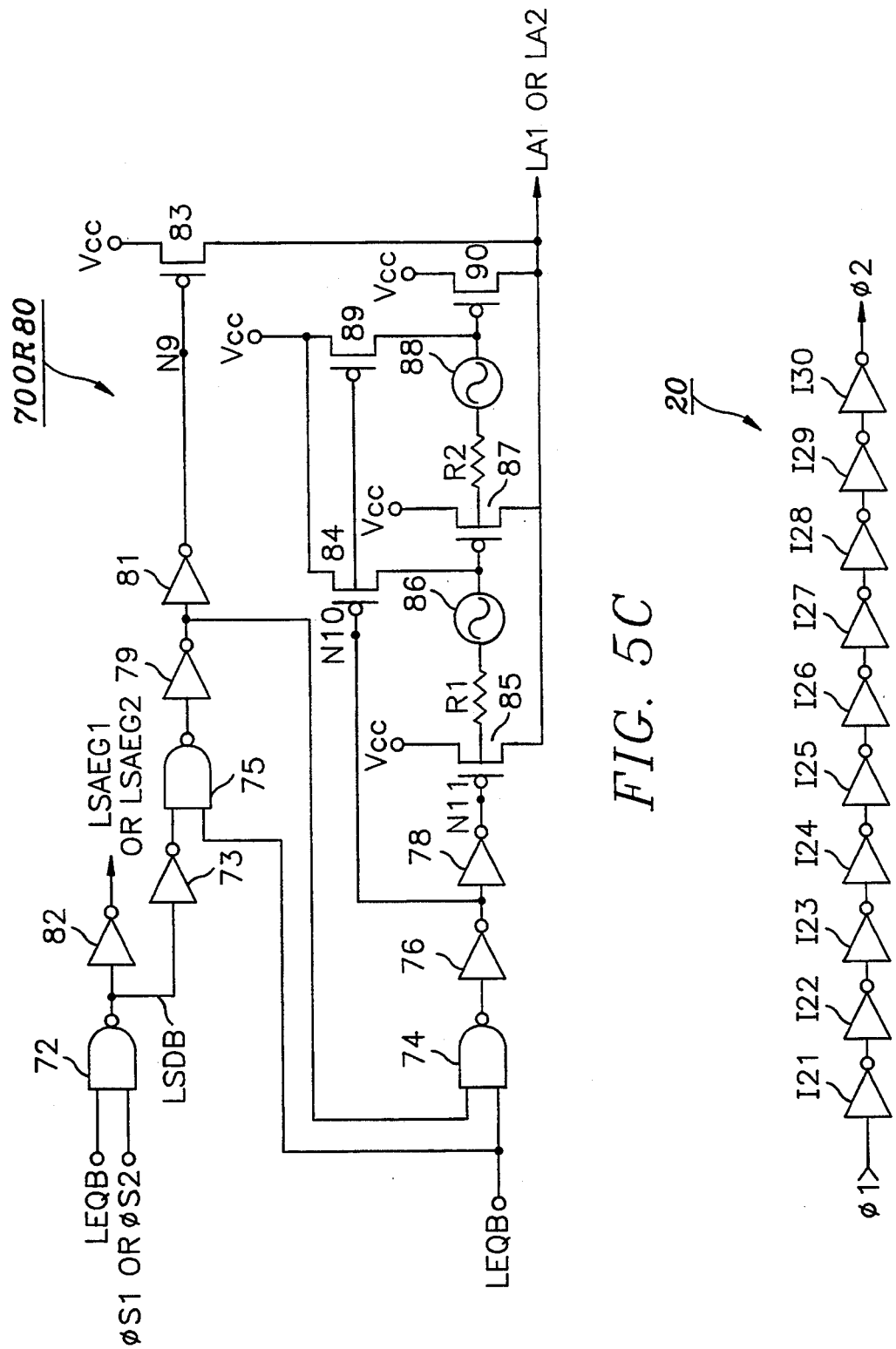
FIG. 5C is a circuit diagram of the first or second bit-line sensing driver of FIG. 4.
FIG. 5D is a circuit diagram of the delay circuit of FIG. 4.

The detailed circuits of the enable clock generator 10, the first word-line enable circuit 30, the first bit-line sensing enable circuit 50 and the first bit-line sensing driver 70 are the same as those used in the conventional circuit described with reference to FIG. 3. The second circuits 40, 60 and 80 have the same circuit architectures as those of their corresponding first circuits 30, 50 and 70, as shown in FIG. 5A, FIG. 5B and FIG. 5C, respectively. The delay circuit 20, as shown in FIG. 5D, can be formed of a serial chain of inverters, as an example ten inverters I21 to I30. The delay time of the second initial activating clock $\phi 2$ from the first initial activating clock $\phi 1$ is determined by the number of inverters in the delay circuit 20. In the description of the present embodiment hereinafter, generating mechanisms of the first sensing signal LA1 (or LSAEG1) and the second sensing signals LA2 (or LSAEG2) are identical except for time delay in operation caused by delay circuit 20.

Figure 7:
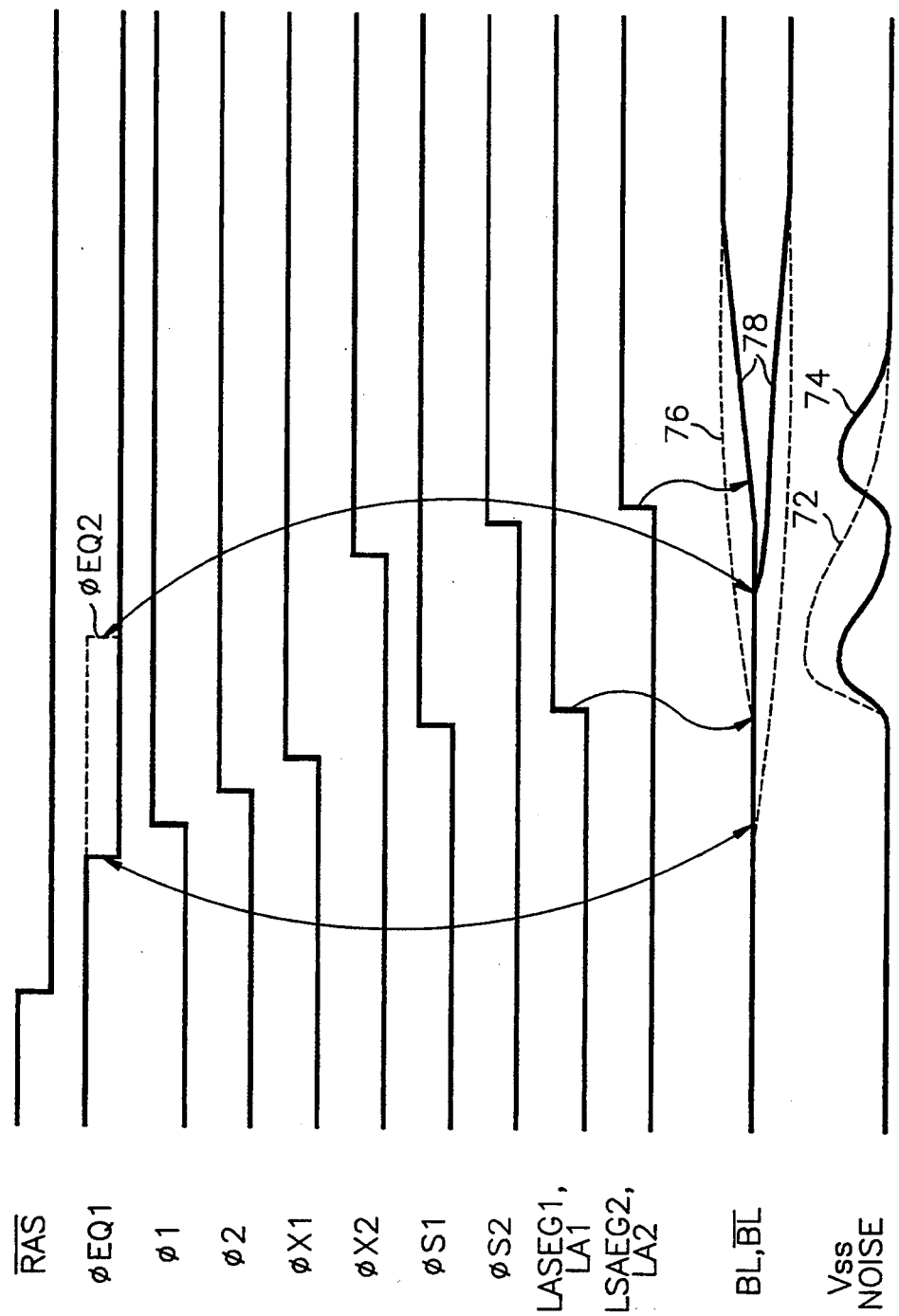
FIG. 7 is a timing diagram illustrating the bit-line sensing operation according to the present invention.

Referring to FIG. 7, when a row address strobe signal $\overline{\text{RAS}}$ is in its precharge cycle as "high" level, both a $\overline{\text{RAS}}$ master clock LR, which has a complementary logic level with that of the $\overline{\text{RAS}}$ and is applied to the first word-line enable circuit 30 of FIG. 5A, and the address informing clock LXE are at a "low" level. A $\overline{\text{RAS}}$ slave clock LXRB, which has an identical logic level with that of $\overline{\text{RAS}}$ and is generated in accordance with the $\overline{\text{RAS}}$ master clock LR, is at a "high" level. Then in FIG. 5A, voltage levels at a first node N1, a second node N2 and a fifth node N5 become "low" level, and voltage levels at a third node N3, a fourth node N4, a sixth node N6, a seventh node N7 and an eighth node N8 all become "high" level, resulting in that voltage level of the first word-line enable signal $\phi X1$ (or second word-line enable clock $\phi X2$) still retains "low".

When the row address strobe signal $\overline{\text{RAS}}$ is in its active cycle as "low" level, the $\overline{\text{RAS}}$ master clock LR, the address informing signal LXE and the $\overline{\text{RAS}}$ master clock LXRB have the voltage levels such as "high", "high" and "low". Then in FIG. 5A, voltage levels at the first node N1, the second node N2, the third node N3, the fifth node N5, the seventh node N7 and the eighth node N8 become "high", and those at the fourth node N4, a sixth node N6 become "high", resulting in that voltage level of the first word-line enable signal $\phi X1$ (or second word-line enable signal $\phi X2$), as shown in FIG. 7, become "high", practically on the voltage level of $Vcc+(\frac{1}{2})Vcc$. The circuit component 300, encircled by a broken line in FIG. 5A, is a boost circuit which can increase a voltage level of the first word-line enable signal $\phi X1$ (or the second word-line enable signal $\phi X2$) to the voltage level of $Vcc+(\frac{1}{2})Vcc$, by means of a pumping operation of capacitor M1, in which its one electrode receives a pumping signal through a transistor TR1 from an output of a NAND gate 36. The NAND gate 36 is controlled by the address informing signal LXE and the $\overline{\text{RAS}}$ master clock LR.

The first word-line enable signal $\phi X1$ (or second word-line enable signal $\phi X2$) is applied to the bit-line sensing enable circuit 50 (or second bit-line sensing enable circuit 60) of FIG. 5B. A NAND gate 69, in FIG. 5B, receiving one input signal passed through serially connected inverters I61, I62, I63, I64, I65 and I66 from the first word-line enable signal $\phi X1$ (or the second word-line enable signal $\phi X2$) and the other input signal as the first word-line enable signal $\phi X1$ (or the second word-line enable signal $\phi X2$), determines an activating time and a pulse width of the first bit-line sensing enable signal $\phi S1$ (or the second bit-line sensing enable signal $\phi S2$), in order to couple the sense amplifier to a pair of bit lines selected be activated after the selected bit-line pair has been developed by charge sharing between the selected memory cell and the bit line.

Figure 1:
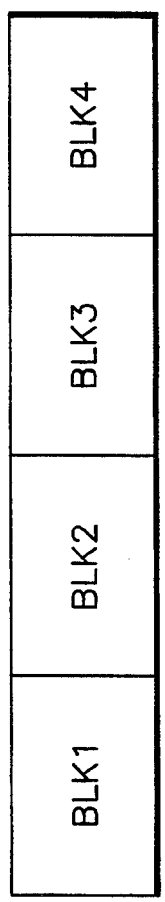
FIG. 1 is a block diagram illustrating of a general semiconductor memory cell array divided into four blocks, as an example.

Referring to FIG. 5C showing the first bit-line sensing driver 70 (or the second bit-line sensing driver 80), through a NAND gate 72 and an inverter 82, the NAND gate receiving the first bit-line sensing enable signal $\phi S1$ (or the second bit-line sensing enable signal $\phi S2$) and being controlled by a block selecting signal LEQB, the first n-type sensing signal LSAEG1 (or the second n-type sensing signal LSAEG2) is generated as shown in FIG. 7 and then turns on the n-type sense amplifier as shown in FIG. 2. Assuming that the first n-type sensing signal LSAEG1 is applied to n-type sense amplifiers selected in the first and third memory cell array blocks BLK1 and BLK3 of FIG. 1, the second n-type sensing signal LSAEG2 is applied to n-type sense amplifiers selected in the second and fourth memory cell array blocks BLK2 and BLK4 after the elapsed time established by the delay circuit 20, and vice versa.

Also, an output signal LSDB of the NAND gate 72, as "low" level, is applied to a gate of the pull-up transistor 83 through an inverter 73, a NAND gate 75, an inverter 79 and 81, to provide the first p-type sensing signal LA1 (or the second p-type sensing signal LA2 after the elapsed time established by the delay circuit 20) for starting the "high" level sensing. An output of the inverter 79 is applied to a NAND gate 74 controlled by the block selecting signal LEQB and thereby the first p-type sensing signal LA1 (or the second p-type sensing signal LA2), already on its way to the "high" level, is further activated to the full "high" level by pull-up operation of transistors 85, 87 and 90. This sequence for generating the p-type sensing signals LA1 or LA2 allows the activation timing for main bit-line sensing and amplifying of the p-type sense amplifier to correspond to the charge sharing timing between the bit line and the memory cell.

The delay interval between the first sensing signals LA1, LSAEG1 and the second sensing signals LA2, LSAEG2 preferably is about 20 ns, as this is the interval when the noises due to spike currents occur during the sensing operation by the first sensing signal LA1 and LSAEG1. Thus, as illustrated in FIG. 7, the sense amplifiers in the first and third memory array blocks sense the bit line changes therein as indicated along lines 76. The sense amplifiers in the second and fourth memory array blocks sense the bit line charges therein delayed in time from the sensing of the bit lines in the first and third memory array blocks, as indicated by lines 78. As a result, two much smaller noise spikes of Vss noise occur, as indicated at line 74, rather than the much larger Vss noise spike that is obtained in a conventional circuit when all the sense amplifiers in, for instance, the four memory blocks, sense the bit lines at the same time. Line 74 indicates the noise spike generated by such a conventional circuit.

Figure 6A:
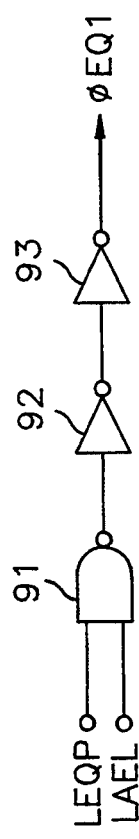
FIG. 6A shows a circuit which generates a first equalizing signal according to the present invention.
Figure 6B:
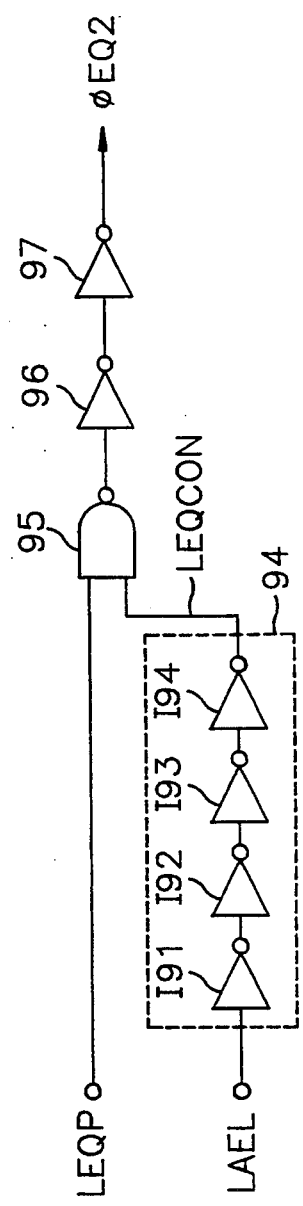
FIG. 6B shows a circuit which generates a second equalizing signal according to the present invention.

Referring to FIGS. 6A and 6B, in order to allow the equalizing operation of bit lines to properly coincide with the bit line sensing operation according to the embodiment of this invention, before and after the bit line sensing operation, the invention provides two equalizing signal generators. A first equalizing signal generator, shown in FIG. 6A, includes a NAND gate 91 that receives a bit-line precharge control signal LEQP and an equalizing timing control signal LAEL. Inverters 92 and 93 are serially connected from the NAND gate 91. The first equalizing signal generator generates a first equalizing signal $\phi$EQ1. A second equalizing signal generator, shown in FIG. 6B, includes a chain of inverters I91, I92, I93 and I94 and a NAND gate 95 that receives the equalizing timing control signal LAEL through the inverter chain and the bit-line precharge control signal LEQP. Inverters 96 and 97 are serially connected from the NAND gate 95. The second equalizing signal generator generates a second equalizing signal $\phi$EQ2. The first equalizing signal $\phi$EQ1 is applied to an equalizing circuit in the first and third memory cell array blocks BLK1 and BLK3 before and after the bit line sensing operation of the blocks BLK1 and BLK3. The second equalizing signal $\phi$EQ2 is applied to an equalizing circuit in the second and fourth memory cell array blocks BLK2 and BLK4, before and after the bit line sensing operation of the blocks BLK1 and BLK3.

As described above, according to this invention, by separating the sensing and equalizing of bit lines in different memory cell array blocks, the superposition of noise during the bit line sensing operation is eliminated. Thus, the semiconductor memory device according to the invention has better sensing characteristics due to much lower noise levels.

While the invention has been particularly shown and described with reference to a preferred embodiment, it will be understood by those skilled in the art that modifications in detail may be made without departing from the spirit and scope of the invention.

For instance, additional sensing delays can be advantageous. Thus, a second delay along with a third word-line enable circuit, a third bit line sensing enable circuit, a third bit line sensing driver circuit and a third equalization circuit can be included. For memories having more than four memory array blocks, having such additional sensing delays can be useful. Furthermore, it is advantageous to physically separate the memory array blocks that are sensed at the same time, as the preferred embodiment described by, with reference to FIG. 1, delaying sensing of memory array blocks BLK2 and BLK 4 from sensing memory array blocks BLK1 and BLK 3. It is possible to further reduce noise effects if a memory array block that is not sensed at all is disposed between two memory array blocks that are sensed with a delay period according to the present invention.

What is claimed is:

1. A bit-line sensing control circuit for a semiconductor memory device having first and second memory cell array blocks, each block including a plurality of bit lines for sensing memory data and a plurality of word lines for accessing said bit lines, each bit line including a plurality of memory cells for storing said memory data to be sensed on said bit lines, said control circuit comprising:

first means for controlling the sensing of first memory data stored in a memory cell on one of said plurality of bit lines of said first block, said first means for controlling being activated by a first initial activating clock;

means for generating a second initial activating clock from said first initial activating clock a predetermined time after initiation of said first initial activating clock; and second means for controlling the sensing of second memory data stored in a memory cell on one of said plurality of bit lines of said second block, said second means for controlling being activated by said second initial activiating clock.

2. A bit-line sensing control circuit according to claim 1, wherein:

said first means for controlling includes first means for activating a first of said plurality of word lines in said first block and first means for initiating sensing of said first memory data; and said second means for controlling includes second means for activating a second of said plurality of word lines in said second block and second means for initiating sensing of said second data.

3. A bit-line sensing control circuit according to claim 2, wherein said first means for activating generates a first word-line enable signal and said first means for initiating sensing generates a first bit-line sensing signal.

4. A bit-line sensing control circuit according to claim 3, wherein said second means for activating generates a second word-line enable signal and said second means for initiating sensing generates a second bit-line sensing signal.

5. A bit-line sensing control circuit according to claim 1, wherein said first initial activating clock is derived from an address informing signal.

6. A bit-line sensing control circuit according to claim 5, wherein said address informing signal is obtained by a validation circuit indicating that a valid address exists for memory cells disposed in said first and second memory blocks.

7. A bit-line sensing control circuit according to claim 1, further comprising a first equalizing signal generator for generating a first equalizing signal to initiate equalization of a first plurality of bit lines disposed in said first memory block and a second equalizing signal generator for generating a second equalizing signal to initiate equalization of a second plurality of bit lines disposed in said second memory block.

8. A bit-line sensing control circuit according to claim 1, wherein said predetermined time is in the range of 10–30 nanoseconds.

9. A bit-line sensing control circuit according to claim 1, wherein said predetermined time is substantially 20 nanoseconds.

10. A random access memory semiconductor memory device comprising:

first, second, third and fourth memory cell array blocks, each memory cell array block including a plurality of bit lines for sensing data bits and a plurality of word lines for accessing said bit lines, each bit line including a plurality of memory cells for storing said data bits;

first means for controlling the sensing of first and third data bits stored in a first memory cell on one of said plurality of bit lines of said first memory block and a third memory cell on one of said plurality of bit lines of said third memory block, respectively, said first means for controlling being activated by a first initial activating clock;

means for generating a second initial activating clock from said first initial activating clock a predetermined time after initiation of said first initial activating clock; and second means for controlling the sensing of second and fourth data bits stored in a second memory cell on one of said plurality of bit lines of said second memory block and a fourth memory cell on one of said plurality of bit lines of said fourth memory block, respectively, said second means for controlling being activated by said second initial activating clock.

11. A bit-line sensing control circuit according to claim 10, wherein:

said first means for controlling includes first means for activating one of said plurality of word lines of said first memory block and one of said plurality of word lines of said third memory block, and first means for initiating sensing of said first data bit and said third data bit; and said second means for controlling includes second means for activating one of said plurality of word lines of said second memory block and one of said plurality of word lines of said fourth memory block, and second means for initiating sensing of said second data bit and said fourth data bit.

12. A bit-line sensing control circuit according to claim 11, wherein said first means for activating generates first and third word-line enable signals for said first and third memory blocks, respectively, and said first means for initiating sensing generates first and third bit-line sensing signals for said first and third memory blocks, respectively.

13. A bit-line sensing control circuit according to claim 12, wherein said second means for activating generates second and fourth word-line enable signals for said second and fourth memory blocks, respectively, and said second means for initiating sensing generates second and fourth bit-line sensing signal for said second and fourth memory blocks, respectively.

14. A bit-line sensing control circuit according to claim 10, wherein said first initial activating clock is derived from an address informing signal.

15. A bit-line sensing control circuit according to claim 14, wherein said address informing signal is obtained by a validation circuit indicating that a valid address exists for memory cells disposed in said first, second, third and fourth memory blocks.

16. A bit-line sensing control circuit according to claim 10, further comprising:

a first equalizing signal generator for generating a first equalizing signal to initiate equalization of said one of said plurality of bit lines of said first memory block and said one of said plurality of bit lines of said third memory block, respectively, and a second equalizing signal generator for generating second and fourth equalizing signals to initiate equalization of said one of said plurality of bit lines of said second memory block and said one of said plurality of bit lines of said fourth memory block, respectively.

17. A bit-line sensing control circuit according to claim 10, wherein said predetermined time is in the range of 10–30 nanoseconds.

18. A bit-line sensing control circuit according to claim 10, wherein said predetermined time is substantially 20 nanoseconds.

19. A bit-line sensing control circuit according to claim 10, wherein said second memory block is disposed in between said first and said third memory blocks.

* * * * *